(12) United States Patent
Yu

(10) Patent No.: US 9,041,200 B2
(45) Date of Patent: May 26, 2015

(54) SEMICONDUCTOR DEVICES HAVING SOLDER TERMINALS SPACED APART FROM MOLD LAYERS AND RELATED METHODS

(71) Applicant: Bongken Yu, Hwaseong-si (KR)

(72) Inventor: Bongken Yu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/259,275

(22) Filed: Apr. 23, 2014

(65) Prior Publication Data

US 2014/0353821 A1 Dec. 4, 2014

(30) Foreign Application Priority Data

Jun. 3, 2013 (KR) .................. 10-2013-0063297

(51) Int. Cl.
 *H01L 23/48* (2006.01)
 *H01L 23/52* (2006.01)
 *H01L 23/00* (2006.01)

(52) U.S. Cl.
 CPC ................ *H01L 24/17* (2013.01); *H01L 24/11* (2013.01)

(58) Field of Classification Search
 USPC ................... 257/787, 737, 686, 780, E23.116
 See application file for complete search history.

(56) References Cited

U.S. PATENT DOCUMENTS

| 5,608,265 | A  | * | 3/1997  | Kitano et al. ................. 257/738 |
| 6,573,610 | B1 | * | 6/2003  | Tsai .............................. 257/780 |
| 7,214,604 | B2 |   | 5/2007  | Kim et al. |
| 7,262,080 | B2 |   | 8/2007  | Go et al. |
| 7,843,059 | B2 | * | 11/2010 | Gomyo et al. ................. 257/723 |
| 8,022,528 | B2 | * | 9/2011  | Kim .............................. 257/686 |
| 8,053,275 | B2 | * | 11/2011 | Hasegawa ...................... 438/106 |
| 2002/0180010 | A1 | * | 12/2002 | Tsubosaki et al. ............ 257/667 |
| 2004/0173915 | A1 | * | 9/2004  | Lee .............................. 257/780 |
| 2007/0018313 | A1 | * | 1/2007  | Gomyo et al. ................. 257/723 |
| 2007/0241463 | A1 |   | 10/2007 | Yamaguchi et al. |
| 2008/0265412 | A1 |   | 10/2008 | Hasegawa |
| 2009/0127686 | A1 |   | 5/2009  | Yang et al. |
| 2010/0090323 | A1 | * | 4/2010  | Shinoda et al. ............... 257/686 |
| 2010/0304530 | A1 |   | 12/2010 | Yim et al. |
| 2011/0221075 | A1 |   | 9/2011  | Meura et al. |
| 2011/0227209 | A1 |   | 9/2011  | Yoon et al. |
| 2011/0260334 | A1 |   | 10/2011 | Hasegawa |
| 2012/0119359 | A1 |   | 5/2012  | Im et al. |
| 2012/0280404 | A1 |   | 11/2012 | Kwon et al. |
| 2013/0112471 | A1 |   | 5/2013  | Cho et al. |
| 2013/0178016 | A1 | * | 7/2013  | Yim et al. ..................... 438/108 |

FOREIGN PATENT DOCUMENTS

| JP | 2006-339491 | 12/2006 |
| JP | 2011-071436 | 4/2011 |
| KR | 1020040056437 | 7/2004 |

(Continued)

*Primary Examiner* — Nitin Parekh
(74) *Attorney, Agent, or Firm* — Myers Bigel Sibley & Sajovec, P.A.

(57) ABSTRACT

A method of forming an electronic device may include providing a solder structure on a surface of a substrate, and a surface of the solder structure spaced apart from the substrate may be planar. A mold layer may be formed on the surface of the substrate, wherein the mold layer surrounds the solder structure and wherein the planar surface of the solder structure is exposed through the mold layer. After forming the mold layer, the solder structure is heated to form a solder terminal having a curved surface spaced apart from the substrate. Related devices are also discussed.

17 Claims, 16 Drawing Sheets

(56) References Cited

FOREIGN PATENT DOCUMENTS

| KR | 1020070051165 | 5/2007 |
| KR | 1020090089017 | 8/2009 |
| KR | 1020100075115 | 7/2010 |
| KR | 1020100129577 | 12/2010 |
| KR | 1020110048119 | 5/2011 |

* cited by examiner

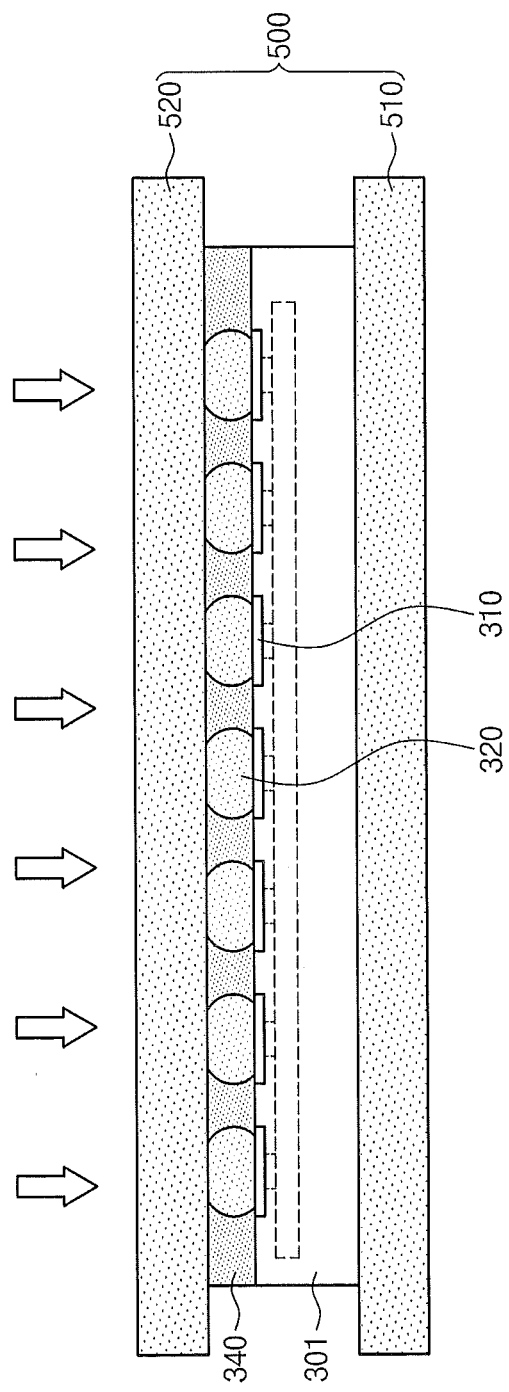

SEMICONDUCTOR DEVICES HAVING SOLDER TERMINALS SPACED APART FROM MOLD LAYERS AND RELATED METHODS

CROSS-REFERENCE TO RELATED APPLICATION

This U.S. non-provisional patent application claims priority under 35 U.S.C. §119 to Korean Patent Application No. 10-2013-0063297, filed on Jun. 3, 2013, in the Korean Intellectual Property Office, the disclosure of which is hereby incorporated by reference in its entirety.

BACKGROUND

Inventive concepts relate to electronic devices and, more particularly, to semiconductor electronic devices having terminals and related methods.

Joint reliability of solder balls may be important for electrical connections between packages and/or between substrates and solder balls. For example, demand for package-on-package (POP) type semiconductor packages is increasing to provide reduced size and multi-function operation of mobile devices. Generally, an upper package including a memory chip is electrically connected to a lower package including a logic chip through solder balls in the POP product. Thus, joint reliability of the solder balls is needed for electrical connection between the upper package and the lower package. Improved joint reliability of solder balls is thus being demanded in various semiconductor devices including POP products.

SUMMARY

Embodiments of inventive concepts may provide semiconductor devices having terminals with improved joint reliability and methods for fabricating the same.

In one aspect of inventive concepts, a semiconductor device may include a lower package including a lower semiconductor chip mounted on a lower package substrate, an upper package including an upper semiconductor chip mounted on an upper package substrate, and a terminal electrically connecting the lower package to the upper package. The lower package may further include a lower mold layer having an opening providing a space in which the terminal is disposed. An inner sidewall of the opening may not be in contact with the terminal.

In some embodiments, the opening may have a quadrilateral shape in a cross-sectional view and a circular shape in a plan view.

In some embodiments, the lower mold layer may surround a sidewall of the lower semiconductor chip, and a top surface of the lower mold layer may be substantially coplanar with a top surface of the lower semiconductor chip.

In some embodiments, the lower mold layer may cover the lower semiconductor chip.

In some embodiments, the terminal may protrude from a top surface of the lower mold layer.

In some embodiments, the lower semiconductor chip may be disposed on a center of the lower package substrate, the terminal may include a plurality of terminals, and the plurality of terminals may be disposed on an edge of the lower package substrate to surround the lower semiconductor chip.

In some embodiments, the terminal may be disposed between an edge of the lower package substrate and an edge of the upper package substrate.

In some embodiments, the semiconductor device may further include an internal terminal disposed between the lower semiconductor chip and the lower package substrate to electrically connect the lower semiconductor chip to the lower package substrate. The lower mold layer may fill a space between the lower semiconductor chip and the lower package substrate to surround the internal terminal.

In some embodiments, the semiconductor memory device may further include a second mold layer disposed on the lower semiconductor chip and having a second opening. The second opening may provide a space in which the internal terminal is disposed, and an inner sidewall of the second opening may not be in contact with the internal terminal.

In another aspect of inventive concepts, a semiconductor device may include a substrate having pads thereon, a mold layer covering the substrate and having openings exposing the pads, and terminals disposed in the openings and electrically connected to the pads. The terminals may not be in contact with the mold layer such that a space may be provided between each of the terminals and an inner sidewall of each of the openings.

In some embodiments, a top surface of the mold layer may be lower than top surfaces of the terminals such that the terminals may protrude from the top surface of the mold layer.

In some embodiments, the top surface of the mold layer may be lower than a level of a center of the terminal.

In some embodiments, the substrate may include a semiconductor wafer that includes an integrated circuit electrically connected to the pads.

In still another aspect of inventive concepts, a method for fabricating a semiconductor device may include providing solder on a top surface of a substrate, pressing the solder to form a solder disk, forming a mold layer on the top surface of the substrate, and forming a solder ball by applying heat to the solder disk. The mold layer may expose a top surface of the solder disk.

In some embodiments, forming the solder ball may include forming an opening in the mold layer. The opening may provide a space in which the solder ball is disposed, and the solder ball may not be in contact with an inner sidewall of the opening.

In some embodiments, forming the solder ball may include forming a second solder ball on a bottom surface of the substrate using an adhesion process of a second solder and a reflow process. The heat may be applied to the solder disk to reflow the solder disk using the reflow process for the formation of the second solder ball.

In some embodiments, the method may further include mounting a semiconductor chip on the top surface of the substrate. The semiconductor chip may be disposed on a center of the top surface of the substrate, and the solder disk may be disposed on an edge of the top surface of the substrate.

In some embodiments, the method may further include grinding the semiconductor chip.

In some embodiments, the method may further include mounting a semiconductor chip on the top surface of the substrate. The semiconductor chip may include a top surface disposed at the same level as a top surface of the solder disk. In this case, forming the mold layer may include filling a space between the semiconductor chip and the solder disk with a mold material to expose top surfaces of the semiconductor chip and the solder disk.

In some embodiments, the method may further include mounting a semiconductor chip on the top surface of the substrate. In this case, forming the mold layer may include forming a mold material covering the solder disk and the semiconductor chip on the top surface of the substrate, and grinding the mold material to expose a top surface of the solder disk.

According to another aspect of inventive concepts, a method of forming an electronic device may include providing a solder structure on a surface of a substrate, wherein a surface of the solder structure spaced apart from the substrate is planar. A mold layer may be formed on the surface of the substrate, wherein the mold layer surrounds the solder structure and wherein the planar surface of the solder structure is exposed through the mold layer. After forming the mold layer, the solder structure may be heated to form a solder terminal having a curved surface spaced apart from the substrate.

Providing the solder structure may include providing a rounded solder structure on the surface of the substrate, and applying mechanical pressure to the rounded solder structure to form the planar surface spaced apart from the substrate.

The solder structure may be in contact with the mold layer before heating the solder structure, and the solder terminal may be spaced apart from the mold layer after heating the solder structure to define an opening between the solder terminal and the mold layer.

The solder terminal may be a first solder terminal, wherein the surface of the substrate is a first surface of the substrate, and wherein the substrate has a second surface with the first surface being between the second surface and the first solder terminal. In addition, a second solder terminal may be provided on the second surface of the substrate, wherein heating the first solder structure to form the first solder terminal further includes heating the second solder terminal to adhere the second solder terminal to the second surface. Moreover, heating the solder structure may include reflowing the first solder structure and the second solder terminal.

The substrate may be a packaging substrate, and a semiconductor chip may be mounted on the surface of the packaging substrate wherein the semiconductor chip is spaced apart from the solder terminal. After mounting the semiconductor chip, a thickness of the semiconductor chip and the mold layer may be reduced, and reducing the thickness of the semiconductor chip and the mold layer may include grinding the semiconductor chip and the mold layer. A surface of the semiconductor chip spaced apart from the substrate and the planar surface of the solder structure may be substantially coplanar, and the surface of the semiconductor chip and the planar surface of the solder structure may be exposed through the mold layer.

Forming the mold layer may include forming the mold layer on the solder structure, and portions of the mold layer may be removed to expose portions of the solder structure. Removing portions of the mold layer may include grinding the mold layer to expose portions of the solder structure.

According to still another aspect of inventive concepts, an electronic device may include a substrate and a mold layer on the substrate. The mold layer may define an opening therethrough, and a width of the opening at a surface of the mold layer spaced apart from the substrate may be no greater than a width of the opening between the surface of the mold layer spaced apart from the substrate and the substrate. A solder terminal may be bonded to the substrate in the opening, wherein the solder terminal is spaced apart from a sidewall of the opening through the mold layer.

The width of the opening between the surface of the mold layer spaced apart from the substrate and the substrate may be greater than the width of the opening at the surface of the mold layer spaced apart from the substrate.

The opening may be undercut so that the width of the opening at the surface of the mold layer spaced apart from the substrate is less than the width of the opening between the surface of the mold layer spaced apart from the substrate and the substrate.

Sidewalls of the opening may be substantially perpendicular with respect to the surface of the substrate.

An entirety of the solder terminal may be spaced apart from the mold layer.

The substrate may be a first substrate, and a second substrate may be bonded to the solder terminal so that the solder terminal provides an electrical and mechanical coupling between the first and second substrates. In addition, a semiconductor chip may be electrically and mechanically coupled to the first substrate so that the semiconductor chip is between the first and second substrates, the semiconductor chip may be spaced apart from the solder terminal.

The solder terminal may be centered in the opening so that a spacing between the solder terminal and the mold layer is substantially uniform around perimeter of the solder terminal in a cross section taken parallel to a surface of the substrate.

According to yet another aspect of inventive concepts, an electronic device may include a packaging substrate and a semiconductor chip electrically and mechanically coupled to the packaging substrate. A mold layer on the substrate may surround the semiconductor chip, and the mold layer may define an opening therethrough spaced apart from the semiconductor chip. A solder terminal may be bonded to the packaging substrate in the opening. The solder terminal may be spaced apart from a sidewall of the first opening through the mold layer, and the solder terminal may be substantially centered in the opening so that a spacing between the solder terminal and the mold layer is uniform around perimeter of the solder terminal in a cross section taken parallel to a surface of the substrate.

The opening may be a first opening, the solder terminal may be a first solder terminal, the mold layer may define a second opening therethrough, and the semiconductor chip may be between the first and second openings. In addition, a second solder terminal may be bonded to the packaging substrate in the second opening. The second solder terminal may be spaced apart from a sidewall of the second opening through the mold layer, and the second solder terminal may be substantially centered in the second opening so that a spacing between the second solder terminal and the mold layer is uniform around a perimeter of the second solder terminal in a cross section taken parallel to the surface of the substrate.

A width of the first opening at a surface of the mold layer spaced apart from the substrate may be no greater than a width of the first opening between the surface of the mold layer spaced apart from the substrate and the substrate, and a width of the second opening at a surface of the mold layer spaced apart from the substrate may be no greater than a width of the second opening between the surface of the mold layer spaced apart from the substrate and the substrate.

The width of the first opening between the surface of the mold layer spaced apart from the substrate and the substrate may be greater than the width of the first opening at the surface of the mold layer spaced apart from the substrate, and the width of the second opening between the surface of the mold layer spaced apart from the substrate and the substrate may be greater than the width of the second opening at the surface of the mold layer spaced apart from the substrate.

The first and second openings may be undercut.

Sidewalls of the first and second openings may be substantially perpendicular with respect to the surface of the substrate.

The packaging substrate may be a first packaging substrate, and a second packaging substrate may be bonded to the solder terminal so that the solder terminal provides electrical and mechanical coupling between the first and second packaging substrates, wherein the semiconductor chip is between the first and second packaging substrates.

The semiconductor chip may be a first semiconductor chip, and a second semiconductor chip may be electrically and mechanically coupled to the second packaging substrate, wherein the second packaging substrate is between the first and second semiconductor chips.

A surface of the semiconductor chip spaced apart from the packaging substrate may be free of the mold layer.

BRIEF DESCRIPTION OF THE DRAWINGS

Inventive concepts will become more apparent in view of the attached drawings and accompanying detailed description.

FIGS. 9A to 9C are cross-sectional views illustrating still another example of methods for fabricating wafer level chips according to embodiments of inventive concepts;

DETAILED DESCRIPTION OF THE EMBODIMENTS

Figure 1A:
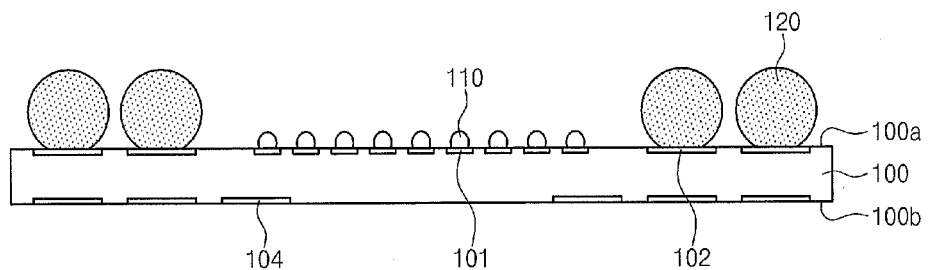
FIGS. 1A to 1G are cross-sectional views illustrating methods for fabricating semiconductor devices according to some embodiments of inventive concepts.

Inventive concepts will now be described more fully hereinafter with reference to the accompanying drawings, in which example embodiments of inventive concepts are shown. Advantages and features of inventive concepts and methods of achieving them will be apparent from the following examples of embodiments that will be described in more detail with reference to the accompanying drawings. It should be noted, however, that inventive concepts are not limited to the following embodiments, and may be implemented in various forms. Accordingly, embodiments are provided herein only to disclose inventive concepts and let those skilled in the art know categories of inventive concepts. In the drawings, embodiments of inventive concepts are not limited to the specific examples provided herein and dimensions may be exaggerated for clarity.

The terminology used herein is for the purpose of describing particular embodiments only and is not intended to limit embodiments of inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description may be described with sectional views as ideal exemplary views of inventive concepts. Accordingly, shapes of the views may be modified according to manufacturing techniques and/or allowable tolerances/errors. Therefore, embodiments of inventive concepts are not limited to the specific shapes illustrated in the views, but may include other shapes that may be created according to manufacturing processes. Areas illustrated in the drawings may have general properties, and are used to illustrate examples of shapes of elements. These examples of shapes, however, should not be construed as limiting the scope of inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of present inventive concepts. Examples of embodiments of aspects of present inventive concepts explained and illustrated herein may also include their complementary counterparts. The same reference numerals or the same reference designators denote the same elements throughout the specification.

Moreover, examples of embodiments are described herein with reference to cross-sectional illustrations and/or plane illustrations that may be idealized exemplary illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle may, typically, have rounded or curved features. Thus, regions illustrated in the figures are schematic in nature and their shapes are not intended to illustrate actual shapes of a region of a device and are not intended to limit the scope of example embodiments.

[An Example of Methods for Fabricating Semiconductor Packages]

FIGS. 1A to 1G are cross-sectional views illustrating methods for fabricating semiconductor devices according to some embodiments of inventive concepts. FIG. 2A is an enlarged perspective view of a portion of FIG. 1F. FIG. 2B is an enlarged cross-sectional view of a portion of FIG. 1F.

Figure 2A:
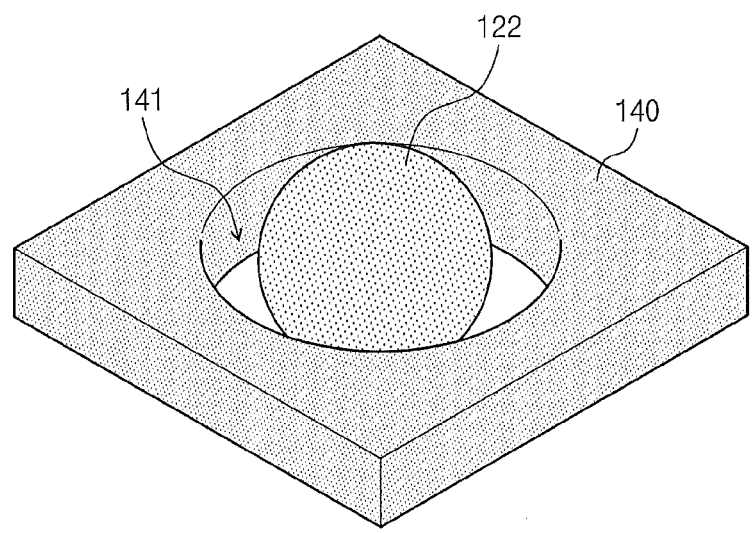
FIG. 2A is an enlarged perspective view of a portion of FIG. 1F.
Figure 2B:
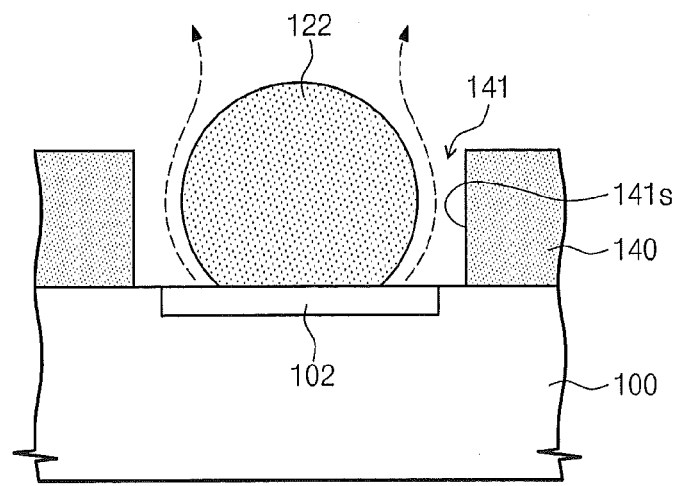
FIG. 2B is an enlarged cross-sectional view of a portion of FIG. 1F.

Referring to FIG. 1A, lower package substrate 100 may be provided. For example, lower package substrate 100 may be a printed circuit board. Bumps 110 may be formed on a center portion of lower package substrate 100. The bumps 110 may be formed by depositing solder and patterning the deposited solder. The bumps 110 may be connected to center pads 101. Solders 120 (e.g., solder balls) may be adhered to a top surface 100a of the lower package substrate 100. The solders 120 may be connected to edge pads 102 provided at/near an edge region of lower package substrate 100. Each solder 120 may have a substantially sphere-shape having a height and a volume greater than those of bumps 110. The lower package substrate 100 may further include lower pads 104 disposed on a bottom surface 100b of the lower package substrate 100.

In the specification, "solder" means a conductor such as, for example, tin, gold, silver, and/or copper, or any alloy thereof (e.g., Sn—In, Sn—Au, Sn—Cu, or Sn—Bi), and "a solder ball" means a conductor in a shape of a sphere (or a portion of a sphere) or a shape similar to a sphere.

Figure 1B:
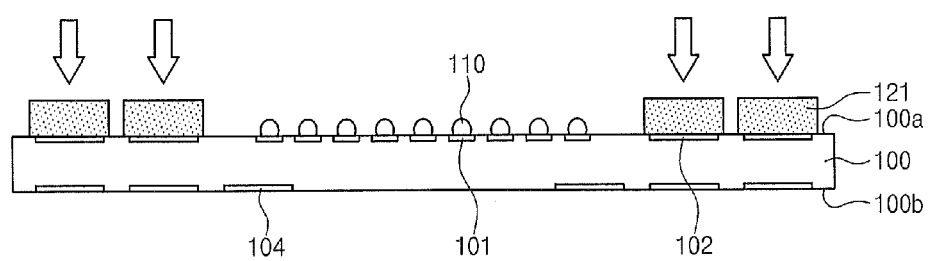

Referring to FIG. 1B, solders 120 may be pressed to be transformed into solder disks 121 having a flat disk-shape. Each solder disk 121 may have a height greater than that of a bump 110. In some embodiments, solders 120 may be pressed to be transformed into solder disks 121 at/near room temperature (e.g., without applying heat, without heating to a reflow temperature, or without heating to a temperature less than the reflow temperature).

Figure 1C:
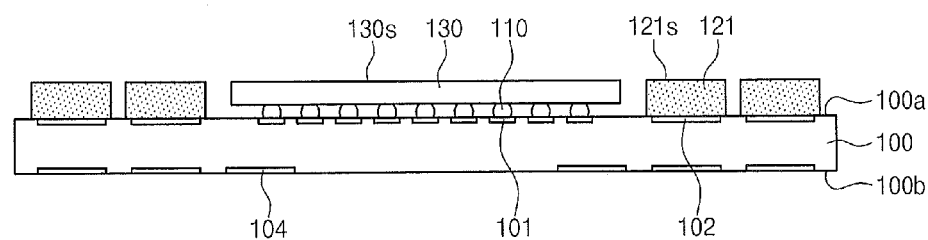

Referring to FIG. 1C, a lower semiconductor chip 130 may be mounted on a top surface 100a of the lower package substrate 100 with electrical and mechanical connection/coupling using bumps 110. The lower semiconductor chip 130 may include a logic chip, a memory chip, or any combination thereof. According to some embodiments, the lower semiconductor chip 130 may be the logic chip. The lower semiconductor chip 130 may be mounted on top surface 100a of lower package substrate 100 using a flip chip bonding technique. According to some embodiments, top surface 121s of solder disks 121 may be disposed at a same or similar level as/to top surface 130s (i.e., a non-active surface) of lower semiconductor chip 130. Solder disks 121 may be arranged to surround lower semiconductor chip 130.

Figure 1D:
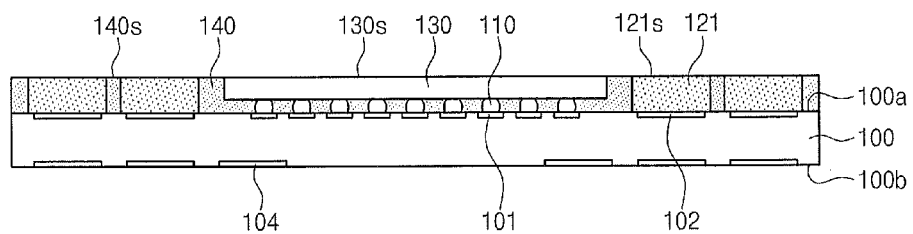

Referring to FIG. 1D, a mold material may be provided on lower package substrate 100 to form lower mold layer 140. A top surface 140s of the lower mold layer 140 may be disposed at a same or a similar level as/to the top surface 121s of solder disk 121 and/or the top surface 130s of lower semiconductor chip 130. In some embodiments, lower mold layer 140 not covering the solder disk 121 and lower semiconductor chip 130 may be formed using an exposed mold underfill (eMUF) process. Lower mold layer 140 may fill a space between lower package substrate 100 and lower semiconductor chip 130. Thus, lower mold layer 140 may surround bumps 110. According to embodiments of FIGS. 1A to 1G, solder disks 121 may not be covered by lower mold layer 140, so that top surfaces 121s of solder disks 121 may be exposed. Thus, a process of exposing solder disks 121 may be omitted. For example, a process of exposing the top surfaces 121s of the solder disks 121 by laser-drilling of lower mold layer 140 may be omitted.

Figure 1E:
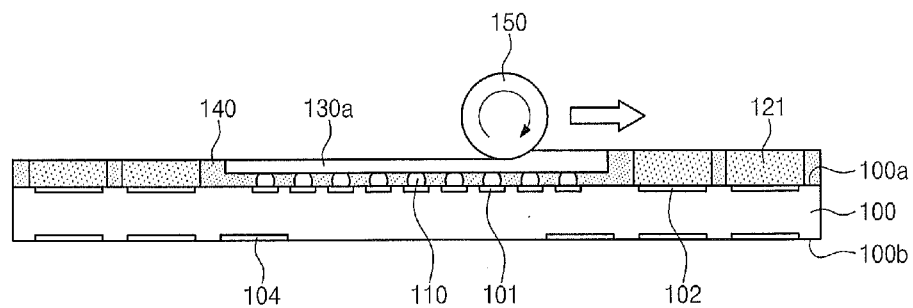

Referring to FIG. 1E, a grinding process may be selectively performed after lower mold layer 140 is formed. For example, solder disks 121, lower semiconductor chip 130, and lower mold layer 140 may be ground using a grinder 150. In other embodiments, solder disks 121, lower semiconductor chip 130, and lower mold layer 140 may be ground using a chemical mechanical polishing (CMP) process. A thinned semiconductor chip 130a may be obtained by the selective grinding. Thus, lower package 10 of FIG. 1G (described later) may be thinned.

Figure 1F:
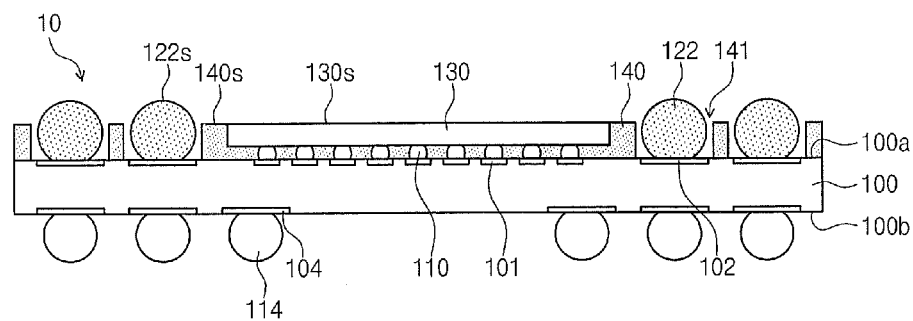

Referring to FIG. 1F, heat may be applied to solder disks 121 to form solder balls 122 after the molding process of FIG. 1D and/or after the grinding process of FIG. 1E. Thus, lower package 10 may be fabricated. Lower package 10 may have a fan-out structure including solder balls 122 surrounding lower semiconductor chip 130. Solder balls 122 may correspond to terminals electrically connecting lower package 10 to an upper package 20 of FIG. 1G.

In some embodiments, when solder balls 114 are formed on lower pads 104 using solder adhesion and reflow operations, solder disks 121 may also reflow together with solder balls 114. Solder disks 121 may be formed into solder balls 122 using the reflow process, and at the same time, solder balls 114 may be formed as external terminals on bottom surface 100b of lower package substrate 100. In other embodiments, after solder disks 121 are formed into solder balls 122 using an additional reflow process, solder balls 114 may be formed to adhere to bottom surface 100b of lower package substrate 100.

Since solder disks 121 are formed into solder balls 122 having a sphere-shape using the reflow process, solder balls 122 may protrude upward from lower mold layer 140. In other words, a top surface 122s of each solder ball 122 may be disposed at a higher level than top surface 140s of lower mold layer 140. Top surface 140s of lower mold layer 140 may have a same or similar level as/to the top surface 130s of lower semiconductor chip 130.

Openings 141 may be formed in lower mold layer 140 when the reflow operation is performed. The openings 141 may have a circular shape in a plan view as illustrated in FIG. 2A and may have a quadrilateral shape in a cross-sectional view as illustrated in FIG. 2B. Inner sidewalls 141s of openings 141 may not be in contact with the solder ball 122, so that a space may be provided between solder balls 122 and lower mold layer 140. Thus, gasses/fumes (which mainly includes ingredients contained in the solder balls 122 in the reflowing process and/or used in the solder adhesion process of FIG. 1A) may easily escape through the openings 141. In FIG. 2B, dotted line arrows represent the exhaust flow of the gasses/fumes. Lower mold layer 140 may act as a dam to prevent/reduce shorts between solder balls 122 adjacent to each other.

Unlike present embodiments, if openings 141 separating solder ball 122 from lower mold layer 140 are not formed, gasses may not be smoothly exhausted causing an increase of gas pressure. The increased gas pressure may generate a crack between a solder ball 122 and a respective edge pad 102 or may separate solder ball 122 from edge pad 102. According to present embodiments, the gasses may smoothly exhaust through the openings 141 such that contact characteristics between solder balls 122 and edge pad 102 may be improved and crack generation may be inhibited/reduced.

In the solder pressing operation of FIG. 1A, solder 120 may be physically damaged, or an adhesive characteristic between solder disks 121 and edge pads 102 may be damaged by shear stress. According to present embodiments, physical damage or reduced wetting of the solder disks 121 may be reduced using the reflow process.

Figure 1G:
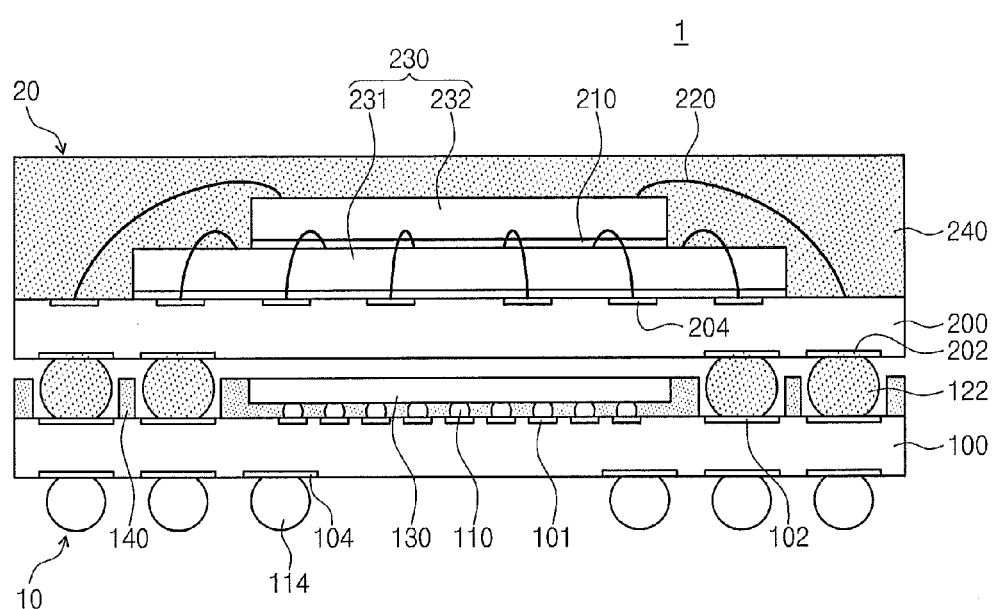

Referring to FIG. 1G, an upper package 20 may be stacked on the lower package 10, thereby fabricating a package-on-package type semiconductor package 1. When the grinding process is further performed, the semiconductor package 1 may be fabricated to include the thinned semiconductor chip 130a of FIG. 1E.

Upper package 20 may include one or more upper semiconductor chips 230 that are stacked on upper package substrate 200 and are encapsulated by upper mold layer 240. Upper semiconductor chips 230 may include a logic chip(s), a memory chip(s), or any combination thereof. For example, upper semiconductor chips 230 may be memory chips.

Using bonding wires 220, upper semiconductor chips 230 may be electrically connected to each other and/or may be electrically connected to upper package substrate 200. A lower chip 231 of upper semiconductor chips 230 may be mounted on upper package substrate 200 with an insulating adhesion layer 210 therebetween, and an upper chip 232 of upper semiconductor chips 230 may be stacked on lower chip 231 with an insulating adhesion layer 210 therebetween. Upper package substrate 200 may be a printed circuit board that includes lower pads 202 connected to solder balls 122 and upper pads 204 connected to bonding wires 220.

In some embodiments, lower pads 202 may be provided at edge portions of a bottom surface of upper package substrate 200. Thus, solder balls 122 may be disposed between edge portions of the lower package substrate 100 and edge portions of the upper package substrate 200.

[Another Example of Methods for Fabricating Lower Packages]

Figure 3A:
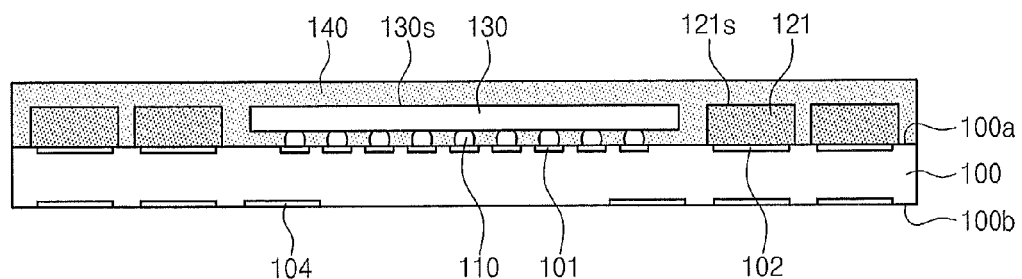
FIGS. 3A to 3C are cross-sectional views illustrating another example of methods for fabricating lower packages for semiconductor devices according to some embodiments of inventive concepts.
Figure 3B:
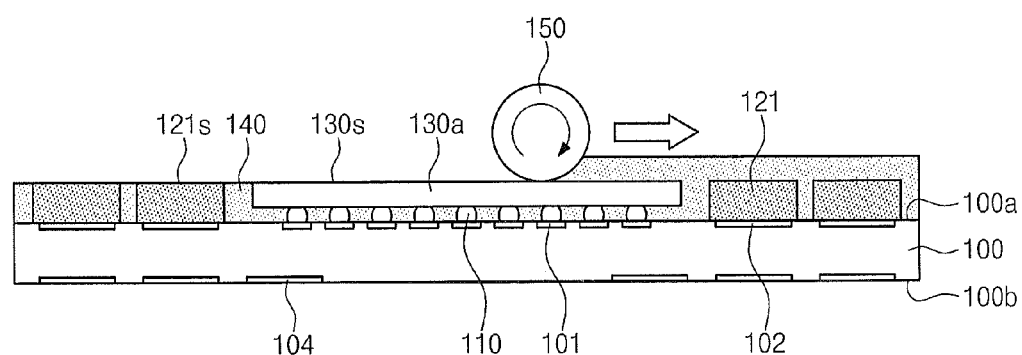
Figure 3C:
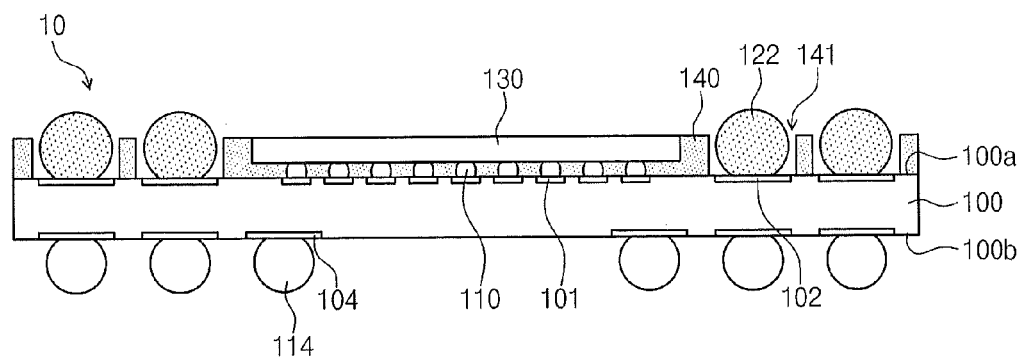

FIGS. 3A to 3C are cross-sectional views illustrating another example of methods for fabricating lower packages for semiconductor devices according to some embodiments of inventive concepts.

Referring to FIG. 3A, solder disks 121 may be formed on a lower package substrate 100 using a solder pressing process, and a lower semiconductor chip 130 may be mounted on lower package substrate 100. Thereafter, a lower mold layer 140 may be formed to cover lower semiconductor chip 130 and solder disks 121. Top surfaces 121s of solder disks 121 may be disposed at a same or similar level as/to a top surface 130s of lower semiconductor chip 130.

Referring to FIG. 3B, lower mold layer 140 may be ground using a grinder 150. Top surfaces 121s of solder disks 121 and top surface 130s of lower semiconductor chip 130 may be exposed using the grinding process. According to some embodiments, solder disks 121 and lower semiconductor chip 130 may be ground along with lower mold layer 140, such that top surfaces 121s of solder disks 121s may be exposed and lower semiconductor chip 130 may be thinned at the same time.

Referring to FIG. 3C, solder balls 114 connected to lower pads 104 may be formed on a bottom surface 100b of lower package substrate 100. Solder disks 121 may be reflowed using a reflow process used to form solder balls 114. Thus, a lower package 10 may be fabricated to include the exposed lower semiconductor chip 130.

[Still Another Example of Methods for Fabricating Lower Packages]

Figure 4A:
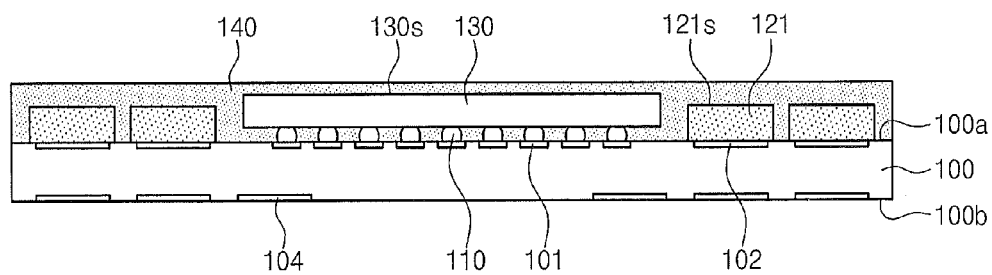
FIGS. 4A to 4C are cross-sectional views illustrating still another example of methods for fabricating lower packages for semiconductor devices according to some embodiments of inventive concepts.
Figure 4B:
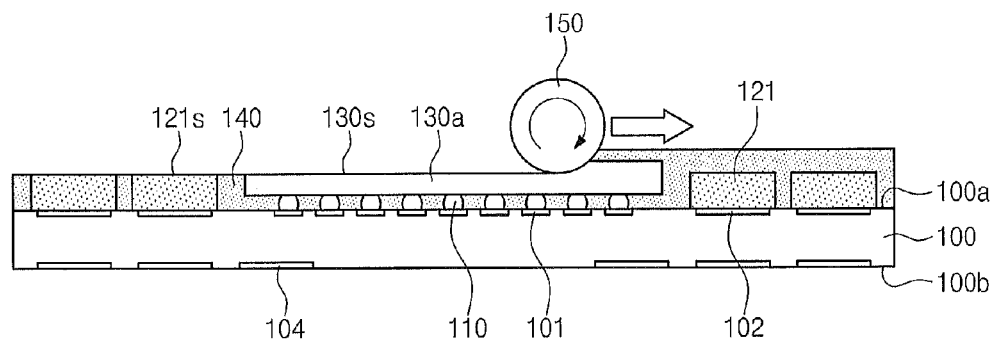
Figure 4C:
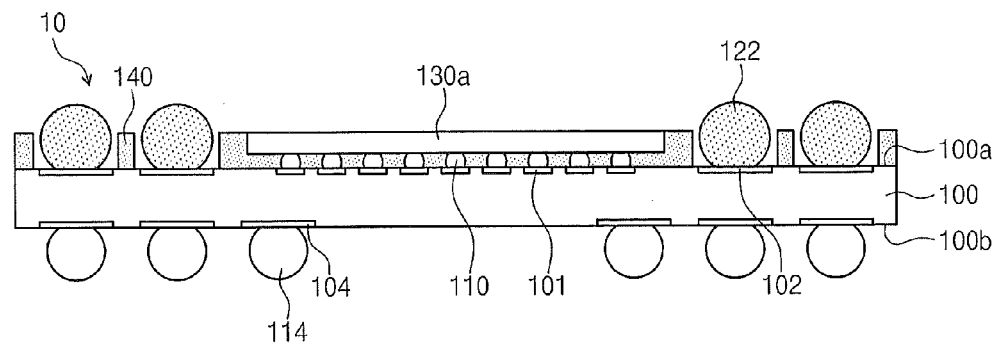

FIGS. 4A to 4C are cross-sectional views illustrating still another example of methods for fabricating lower packages for semiconductor devices according to some embodiments of inventive concepts.

Referring to FIG. 4A, solder disks 121 may be formed on a lower package substrate 100 using a solder pressing process and a lower semiconductor chip 130 may be mounted on lower package substrate 100. Thereafter, a lower mold layer 140 may be formed to cover lower semiconductor chip 130 and solder disks 121. Top surface 121s of solder disks 121 may be disposed at a lower level than a top surface 130s of lower semiconductor chip 130.

Referring to FIG. 4B, lower mold layer 140 may be ground using grinder 150 to expose solder disks 121. Since top surface 130s of lower semiconductor chip 130 is disposed at a higher level than top surfaces 121s of solders disk 121, lower semiconductor chip 130 may be ground along with lower mold layer 140. Using the grinding process, top surfaces 121s of solder disks 121 may be exposed and a thinned semiconductor chip 130a may be obtained at the same time.

Referring to FIG. 4C, solder balls 114 connected to lower pads 104 may be formed on a bottom surface 100b of lower package substrate 100. Solder disks 121 may also be reflowed using a reflow process used to form solder balls 114, thereby fabricating a lower package 10 having the thinned semiconductor chip 130a that is exposed.

[Yet Another Example of Methods for Fabricating Lower Packages]

Figure 5A:
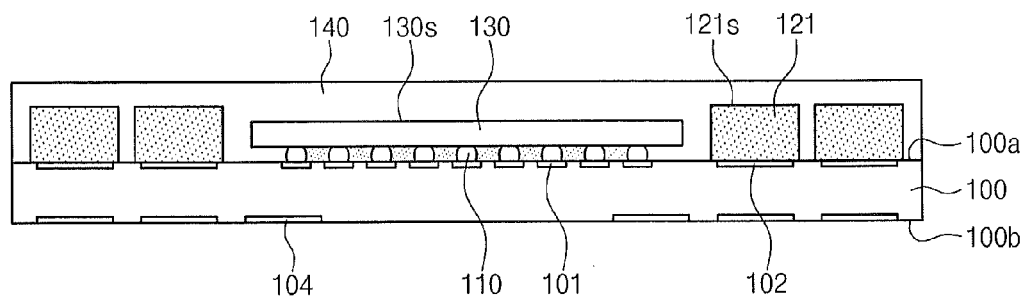
FIGS. 5A to 5C are cross-sectional views illustrating yet another example of methods for fabricating lower packages for semiconductor devices according to some embodiments of inventive concepts.
Figure 5B:
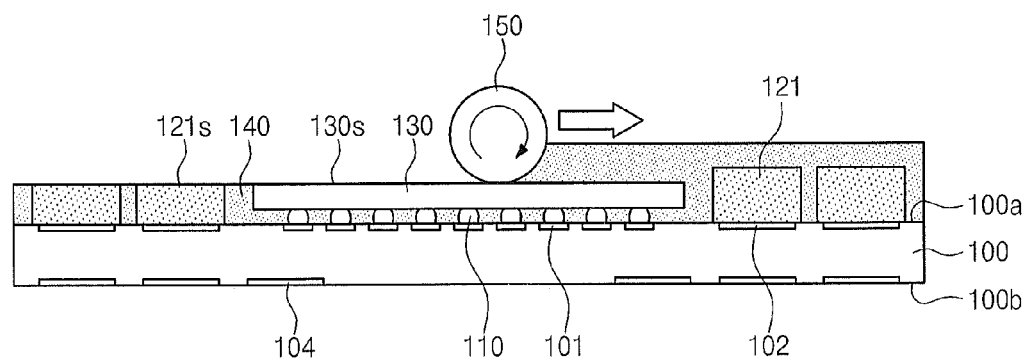
Figure 5C:
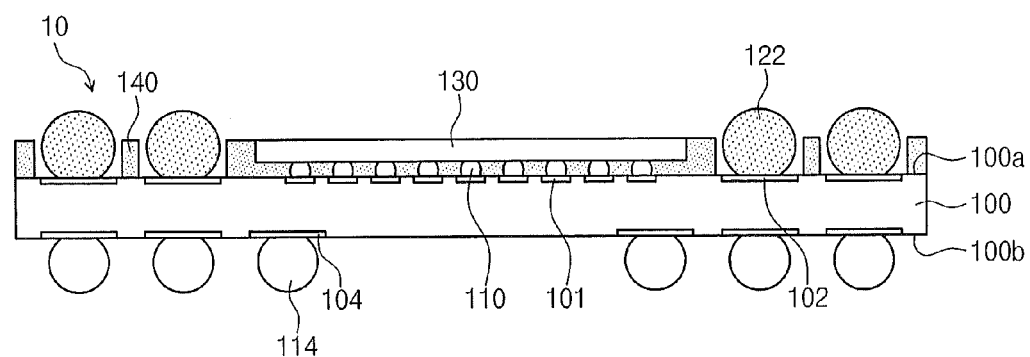

FIGS. 5A to 5C are cross-sectional views illustrating yet another example of methods for fabricating lower packages for semiconductor devices according to some embodiments of inventive concepts.

Referring to FIG. 5A, solder disks 121 may be formed on a lower package substrate 100 using a solder pressing process and a lower semiconductor chip 130 may be mounted on lower package substrate 100. Thereafter, a lower mold layer 140 may be formed to cover lower semiconductor chip 130 and solder disks 121, Top surfaces 121s of solder disks 121 may be disposed at a higher level than a top surface 130s of lower semiconductor chip 130.

Referring to FIG. 5B, the lower mold layer 140 may be ground using grinder 150 to expose lower semiconductor chip 130. Since top surfaces 121s of solder disks 121 are disposed at a higher level than top surface 130s of lower semiconductor chip 130, solder disks 121 may be ground along with lower mold layer 140.

Referring to FIG. 5C, the solder disks 121 may be reflowed using a reflow process used to form solder balls 114 adhered to a bottom surface 100b of lower package substrate 100. Thus, a lower package 10 may be fabricated to include the exposed lower semiconductor chip 130.

[Yet Still Another Example of Methods for Fabricating Lower Packages]

Figure 6A:
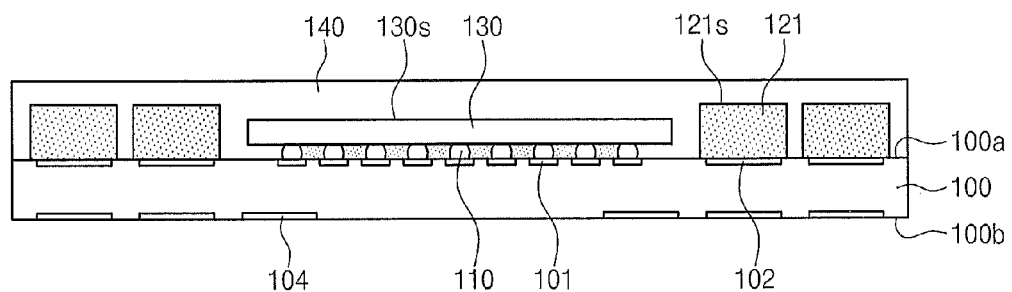
FIGS. 6A to 6C are cross-sectional views illustrating still another example of methods for fabricating lower packages for semiconductor devices according to some embodiments of inventive concepts.
Figure 6B:
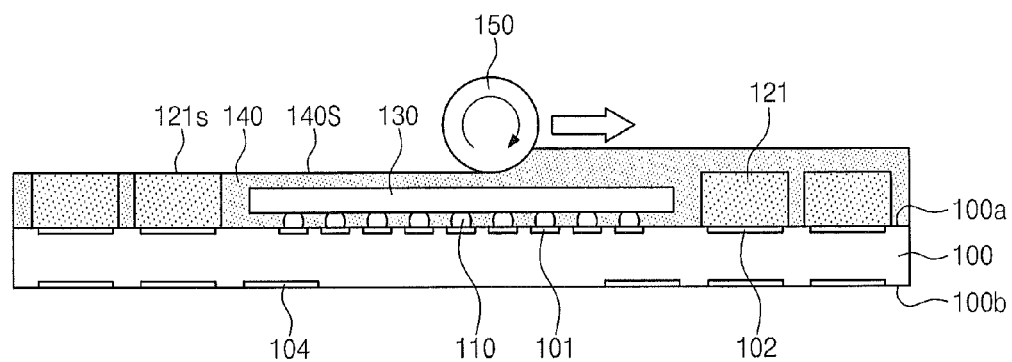
Figure 6C:
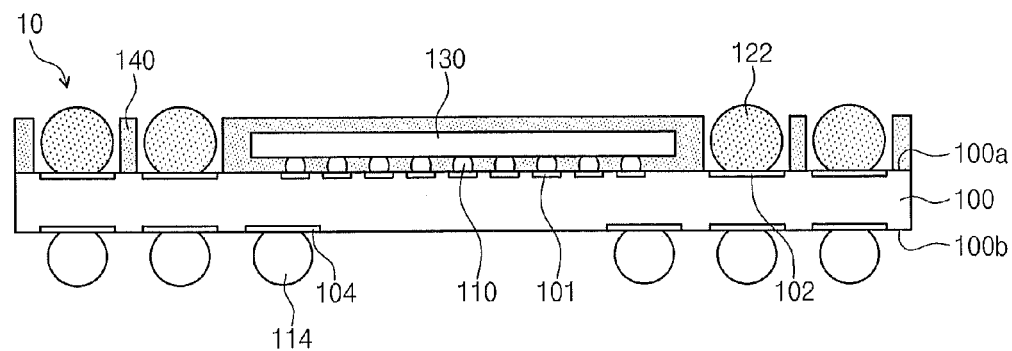

FIGS. 6A to 6C are cross-sectional views illustrating yet still another example of methods for fabricating lower packages for semiconductor devices according to some embodiments of inventive concepts.

Referring to FIG. 6A, solder disks 121 may be formed on a lower package substrate 100 using a solder pressing process and a lower semiconductor chip 130 may be mounted on lower package substrate 100. Thereafter, a lower mold layer 140 may be formed to cover lower semiconductor chip 130 and solder disks 121. Top surfaces 121s of solder disks 121 may be disposed at a higher level than a top surface 130s of lower semiconductor chip 130.

Referring to FIG. 6B, the lower mold layer 140 may be ground using a grinder 150 to selectively expose solder disks 121 in a state that lower semiconductor chip 130 is not exposed. Thus, top surfaces 121s of solder disks 121 may be substantially coplanar with the ground top surface 140s of lower mold layer 140.

Referring to FIG. 6C, the solder disks 121 may be reflowed using a reflow process used to form solder balls 114 adhered to a bottom surface 100b of lower package substrate 100. Thus, a lower package 10 may be fabricated to include lower semiconductor chip 130 covered by lower mold layer 140.

[Another Embodiment of Methods for Fabricating Semiconductor Packages]

FIGS. 7A to 7G are cross-sectional views illustrating methods for fabricating semiconductor devices according to other embodiments of inventive concepts.

Figure 7A:
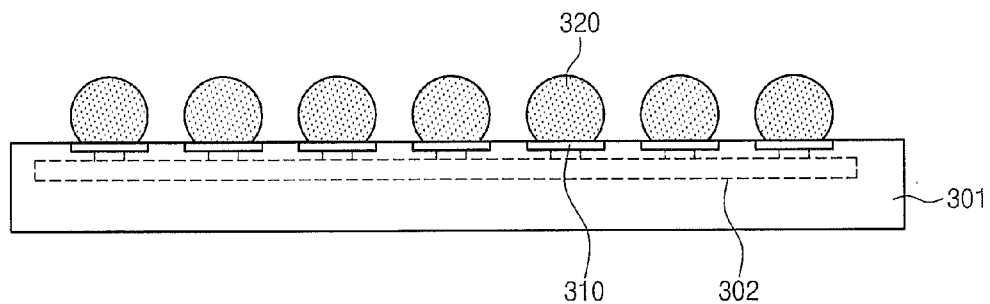
FIGS. 7A to 7G are cross-sectional views illustrating methods for fabricating semiconductor devices according to other embodiments of inventive concepts.

Referring to FIG. 7A, a plurality of solders 320 may be adhered on a wafer 301. The wafer 301 may be, for example, a silicon wafer. The wafer 301 may include pads 310 connected to the solders 320, and an integrated circuit 302 electrically connected to the pads 310. Integrated circuit 302 may include a memory circuit, a logic circuit, or any combination thereof.

Figure 7B:
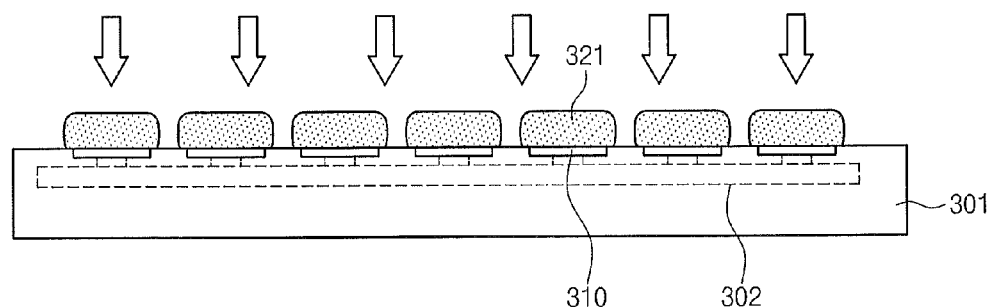

Referring to FIG. 7B, the solders 320 may be pressed to be transformed into solder disks 321 having a flat disk shape. In some embodiments, the solders 320 may be pressed to be transformed into solder disks 321 at/near room temperature (e.g., without applying heat, without heating to a reflow temperature, or without heating to a temperature less than the reflow temperature).

Figure 7C:
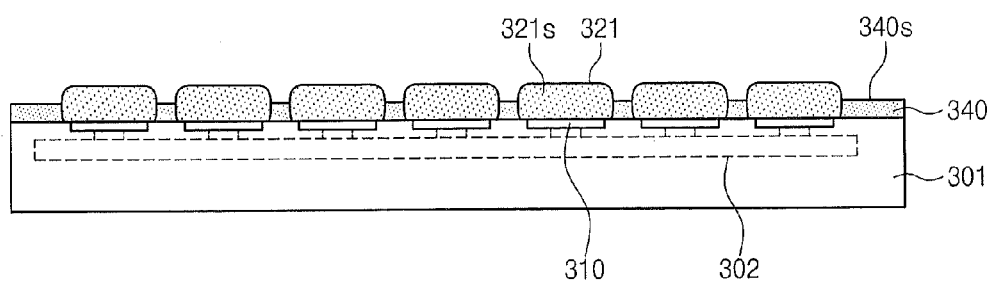

Referring to FIG. 7C, a mold layer 340 may be formed on wafer 301. A top surface 340s of mold layer 340 may be disposed at a lower level than top surfaces 321s of solder disks 321.

Figure 7D:
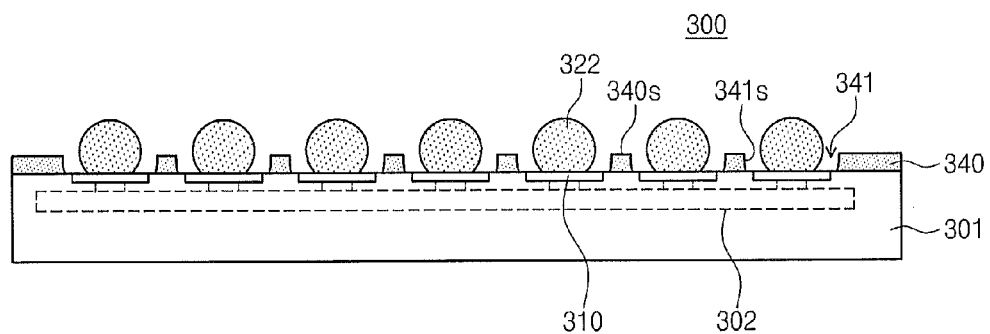

Referring to FIG. 7D, solder disks 321 may be reflowed to form solder balls 322, thereby fabricating a wafer level chip 300. According to present embodiments, top surface 340s of mold layer 340 may have a level equal to or less than a height of a center of solder balls 322. Openings 341 may be formed in mold layer 340 when the reflow process is performed. Each opening 341 may have a circular shape that is the same as or similar to that illustrated in FIG. 2A in a plan view and may have a quadrilateral shape that is the same as or similar to that illustrated in FIG. 2B in a cross-sectional view.

An inner sidewall 341s of each opening 341 may be spaced apart from the respective solder ball 322, thereby providing a space separating the solder ball 322 from the mold layer 340. Thus, gasses or fumes contained in solder material and released during an adhesion process of solders 320 and/or a reflow process of solder disks 321 may be easily exhausted through openings 341. Since a gas pressure increase phenomenon is reduced and/or does not occur due to the easy exhaust of the gas, separation between solder balls 322 and pads 310 may be reduced/inhibited. Additionally, wettability between solder balls 322 and pads 310 may be improved during by the reflow process.

Figure 7E:
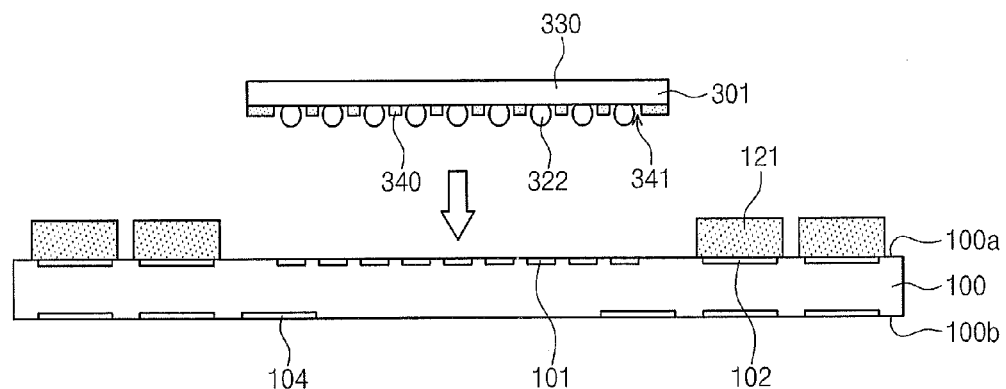

The wafer level chip 300 may be sawed into a plurality of semiconductor chips 330, one of which is illustrated in FIG. 7E. The semiconductor chip 300 may be packaged as described later.

Referring to FIG. 7E, the semiconductor chip 330 may be mounted on a lower package substrate 100 using a flip chip bonding technique. In some embodiments, solder balls 322 of semiconductor chip 330 may be connected to center pads 101 provided on a top surface 100a of lower package substrate 100, such that semiconductor chip 330 may be mounted on lower package substrate 100. Lower package substrate 100 may include solder disks 121 transformed by a process that is the same as or similar to solder pressing processes described with reference to FIGS. 1A and 1B.

According to some embodiments, heat may be additionally applied to improve contact characteristics between solder balls 322 and center pads 101 when semiconductor chip 330 is mounted on lower package substrate 100. Solder balls 322 may be reflowed using the additionally applied heat, and gasses or fumes may be exhausted through openings 341. Thus, it may be possible to reduce/inhibit a phenomenon that solder balls 322 are separated from center pads 101 or that cracks occur between the solder balls 322 and center pads 101.

In other embodiments, after wafer 301 (including the sold disks 321) is mounted on lower package substrate 100, the reflow process may be performed to form solder balls 322. For example, after mold layer 340 is formed as illustrated in FIG. 7C, the reflow process of FIG. 7D may be omitted and wafer 301 may be sawed to be divided into semiconductor chips 330 including the solder disks 321. Thereafter, semiconductor chip 330 may be mounted on lower package substrate 100, and then the reflow process may be performed in the state that solder disks 321 are in contact with center pads 101, thereby forming solder balls 322.

Figure 7F:
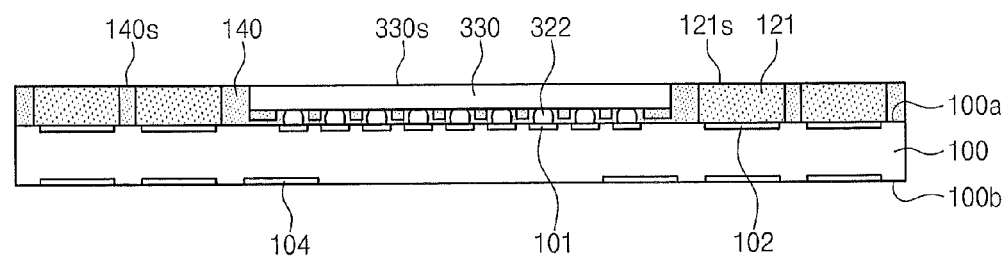

Referring to FIG. 7F, a lower mold layer 140 not covering solder disks 121 and semiconductor chip 330 may be formed on lower package substrate 100 using, for example, an eMUF process. Thus, a top surface 140s of lower mold layer 140 may be disposed at a same or similar level as/to top surfaces 121s of solder disks 121 and/or a top surface 330s (i.e., a non-active surface) of semiconductor chip 330.

Lower mold layer 140 may fill a space between semiconductor chip 330 and lower package substrate 100 to fill openings (see 341 of FIG. 7E) of mold layer 340. Additionally, since lower mold layer 140 does not cover solder disks 121, a laser-drilling or grinding process performed on the lower mold layer 140 to expose the solder disks 121 may be omitted. Selectively, a grinding process as illustrated in FIG. 1E may be further performed to thin semiconductor chip 330.

Figure 7G:
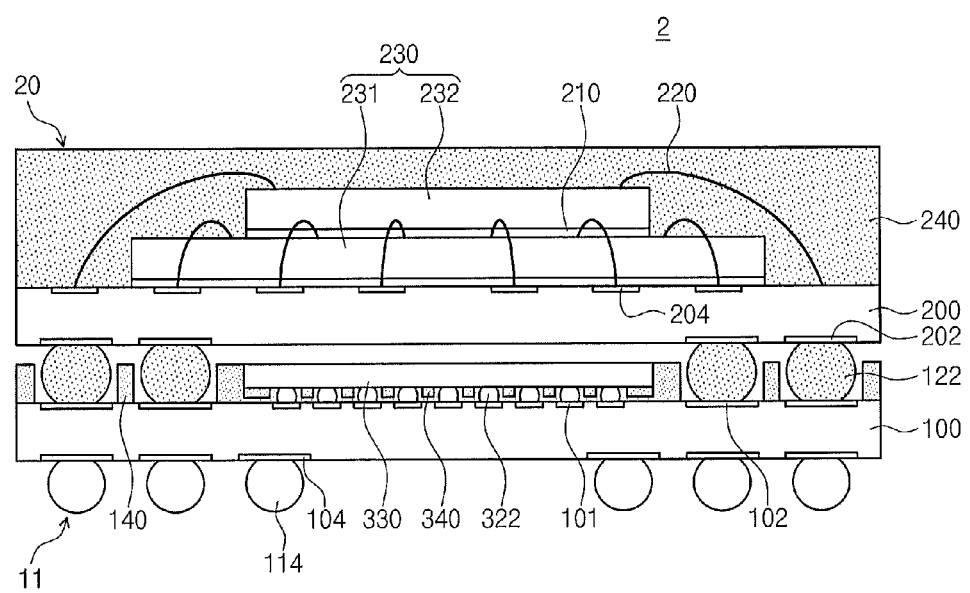

Referring to FIG. 7G, the solder disks 121 may be reflowed to form solder balls 122, thereby fabricating a lower package 11. In some embodiments, solder disks 121 may be reflowed using a reflow process used to form solder balls 114 adhered to a bottom surface of lower package substrate 100, thereby forming solder balls 122. An upper package 20 may be stacked on the lower package 11 to fabricate a package-on-package type semiconductor package 2. The upper package 20 may include one or more upper semiconductor chips 230 that are encapsulated by an upper mold layer 240 and connected to an upper package substrate 200 through wires 200. Solder balls 322 may correspond to terminals electrically connecting lower package 11 to upper package 20.

[Another Example of Methods for Fabricating Wafer Level Chips]

Figure 8A:
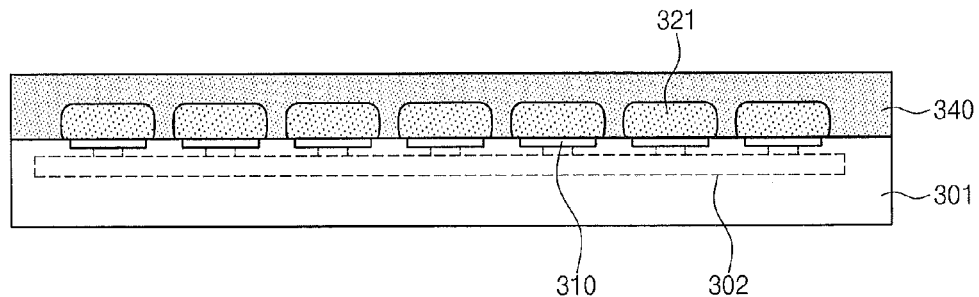
FIGS. 8A to 8C are cross-sectional views illustrating another example of methods for fabricating wafer level chips according to embodiments of inventive concepts.
Figure 8B:
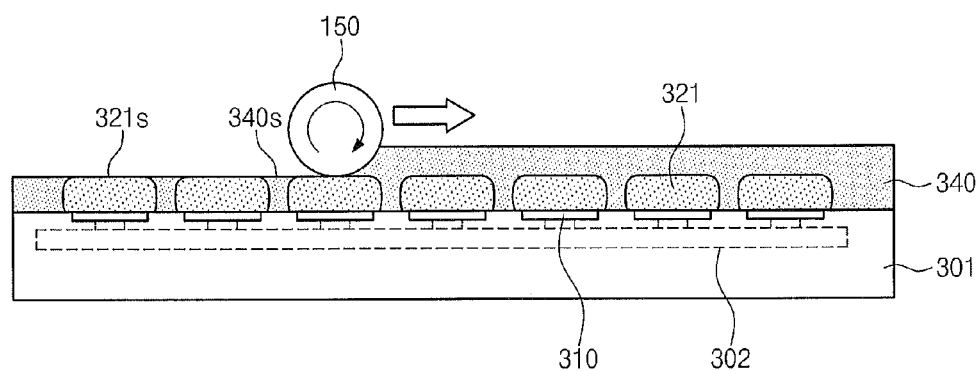
Figure 8C:
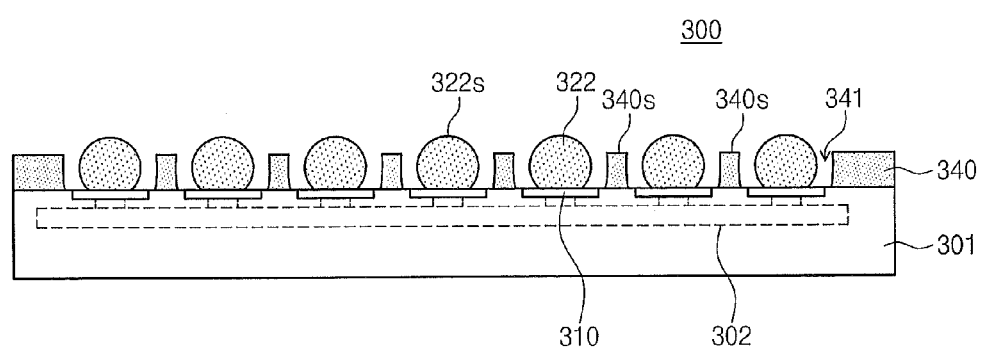

FIGS. 8A to 8C are cross-sectional views illustrating another example of methods for fabricating wafer level chips according to embodiments of inventive concepts.

Referring to FIG. 8A, a mold layer 340 covering solder disks 321 may be formed on a wafer 301. As described with reference to FIGS. 7A and 7B, the solders 320 may be adhered on the wafer 301 and then may be pressed to be transformed into solder disks 321.

Referring to FIG. 8B, mold layer 340 may be ground to expose solder disks 321. Thus, a top surface 340s of the ground mold layer 340 may be substantially coplanar with top surfaces 321s of solder disks 321.

Referring to FIG. 8C, solder disks 321 may be reflowed to form solder balls 322, thereby fabricating a wafer level chip 300. According to present embodiments, top surface 340s of mold layer 340 may have a level lower than top surfaces 322s of solder balls 322 and equal to or higher than a center of solder ball 322.

[Still Another Example of Methods for Fabricating Wafer Level Chips]

Figure 9B:
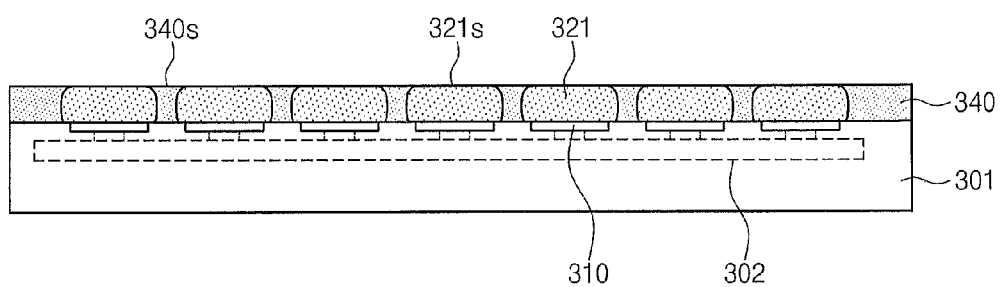
Figure 9C:
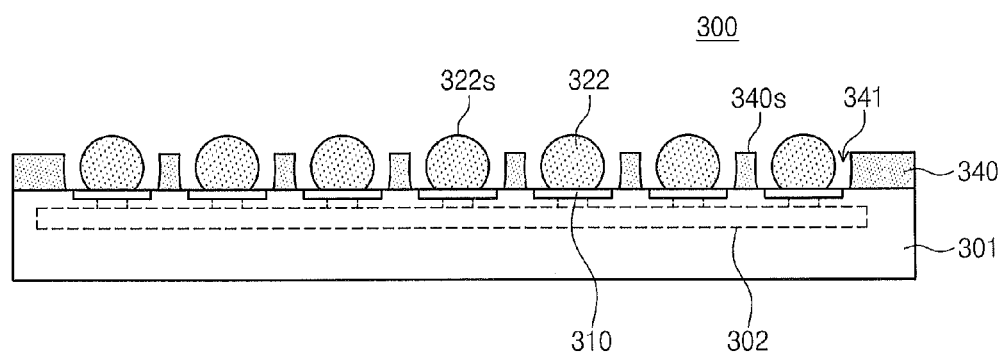

FIGS. 9A to 9C are cross-sectional views illustrating still another example of methods for fabricating wafer level chips according to embodiments of inventive concepts.

Referring to FIG. 9A, solders 320 and mold layer 340 are formed on a wafer 301 and then wafer 301 may be loaded in a mold apparatus 500 to press solder balls 320 and mold layer 340. For example, wafer 301 may be mounted on a lower mold 510 and then the solders 320 and the mold layer 340 may be pressed by an upper mold 520. The mold layer 340 may fill a space between adjacent solders 320 and/or may cover the solders 320. In other embodiments, wafer 301 including solders 320 may be loaded in mold apparatus 500 and then solders 320 may be pressed by upper mold 520. A mold material may be provided into the mold apparatus 500 to form the mold layer 340 when the solders 320 are pressed.

Referring to FIG. 9B, mold layer 340 filling a space between adjacent solder disks 321 may be formed on the wafer 301 by the pressing process. A top surface 340s of mold layer 340 may be substantially coplanar with top surfaces 321s of solder disks 321.

Referring to FIG. 9C, solder disks 321 may be reflowed to form solder balls 322. Thus, a wafer level chip 300 may be fabricated. The top surface 340s of the mold layer 340 may have a level lower than top surfaces 322s of solder balls 322 and equal to or higher than a center of solder balls 322.

[Examples of Applications]

Figure 10A:
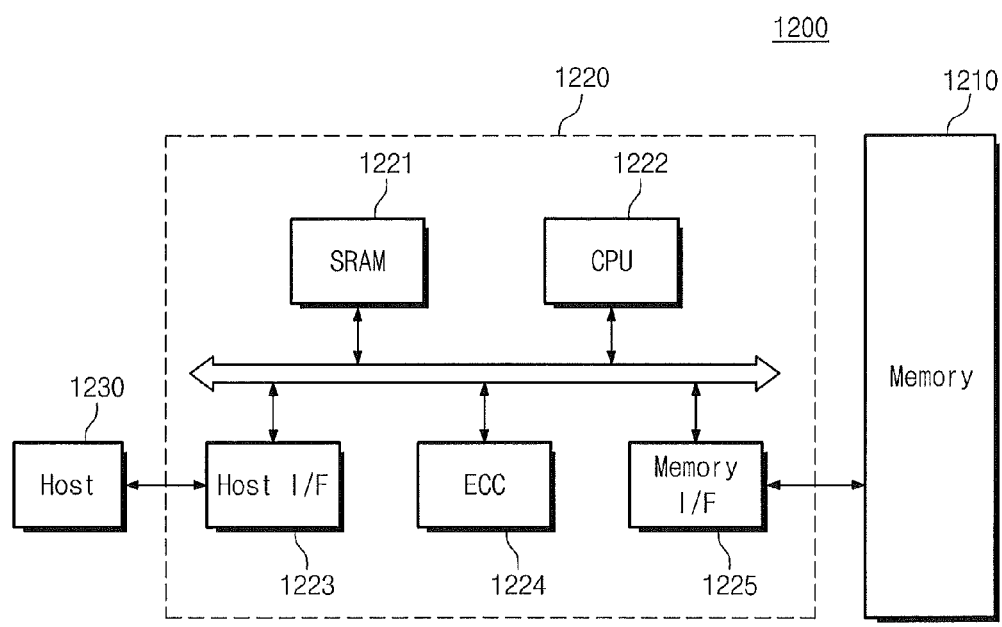
FIG. 10A is a schematic block diagram illustrating a memory card including semiconductor devices according to embodiments of inventive concepts.
Figure 10B:
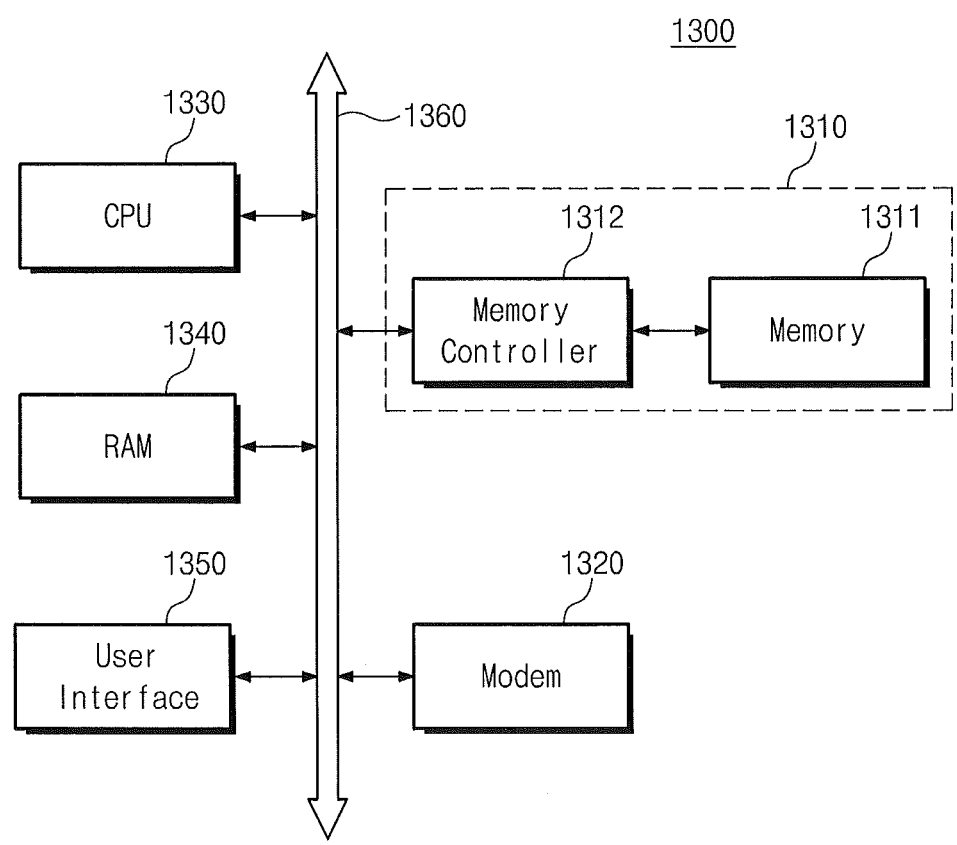
FIG. 10B is a schematic block diagram illustrating an information processing system applied with semiconductor devices according to embodiments of inventive concepts.

FIG. 10A is a schematic block diagram illustrating a memory card including semiconductor devices according to embodiments of inventive concepts. FIG. 10B is a schematic block diagram illustrating an information processing system including semiconductor devices according to embodiments of inventive concepts.

Referring to FIG. 10A, a memory device 1210 including at least one of the semiconductor packages 1 and 2 according to the aforementioned embodiments of inventive concepts may be applied to a memory card 1200. In some embodiments, the memory card 1200 may include a memory controller 1220 that controls data communication between a host 1230 and the memory device 1210. A static random access memory (SRAM) device 1221 may be used as an operational memory of a central processing unit (CPU) 1222. A host interface unit 1223 may be configured to include a data communication protocol between memory card 1200 and host 1230. An error check and correction (ECC) block 1224 may detect and correct errors of data which are read out from memory device 1210. A memory interface unit 1225 may interface with memory device 1210. The CPU 1222 may perform overall operations for data exchange of the memory controller 1220.

Referring to FIG. 10B, an information processing system 1300 may include a memory system 1310 including at least one of the semiconductor packages 1 and 2 according to the embodiments of inventive concepts. The information processing system 1300 may include a mobile device or a computer. For example, the information processing system 1300 may include a modem 1320, a central processing unit (CPU) 1330, a RAM 1340 and a user interface unit 1350 that are electrically connected to the memory system 1310 through a system bus 1360. The memory system 1310 may include a memory device 1311 and a memory controller 1312. The memory system 1310 may be substantially the same as the memory card 1200 of FIG. 10A. The memory system 1310 may store data processed by the CPU 1330 or data input from an external system.

The information processing system 1300 may be realized as a memory card, a solid state disk (SSD), a camera image sensor, and/or other application chipsets. In some embodiments, the memory system 1310 may be an SSD. In this case, the information processing system 1300 may stably and reliably store large quantities of data in the memory system 1310.

According to embodiments of inventive concepts, the solder may be transformed into the flat disk shape and then the flat disk shape may be reflowed to separate the solder ball from the mold layer. Thus, gasses/fumes occurring in the reflow process may be easily exhausted. As a result, gasses/fumes of the reflow process may be easily exhausted to improve joint reliability between solder balls and pads. Additionally, a laser-drilling process to expose the solder may be omitted. Thus, processes for fabricating the semiconductor package may be simplified, and/or a fine pitch of the solder balls may be realized thereby increasing a density of solder interconnections.

While inventive concepts have been described with reference to example embodiments, it will be apparent to those skilled in the art that various changes and modifications may be made without departing from the spirit and scope of inventive concepts. Therefore, it should be understood that the above embodiments are not limiting, but illustrative. Thus, the scope of inventive concepts is to be determined by the broadest permissible interpretation of the following claims and their equivalents, and shall not be restricted or limited by the foregoing description.

That which is claimed is:

1. An electronic device comprising:
    a substrate; a semiconductor chip electrically and mechanically coupled to the substrate;
    a mold layer on the substrate surrounding the semiconductor chip wherein the mold layer defines an opening therethrough, and wherein a width of the opening at a surface of the mold layer spaced apart from the substrate is no greater than a width of the opening between the surface of the mold layer spaced apart from the substrate and the substrate; and
    a solder terminal bonded to the substrate in the opening, wherein an entirety of the solder terminal is spaced apart from a sidewall of the opening through the mold layer.

2. The electronic device according to claim 1 wherein the width of the opening between the surface of the mold layer spaced apart from the substrate and the substrate is greater than the width of the opening at the surface of the mold layer spaced apart from the substrate.

3. The electronic device according to claim 1 wherein the opening is undercut so that the width of the opening at the surface of the mold layer spaced apart from the substrate is less than the width of the opening between the surface of the mold layer spaced apart from the substrate and the substrate.

4. The electronic device according to claim 1 wherein sidewalls of the opening are substantially perpendicular with respect to the surface of the substrate.

5. The electronic device according to claim 1, wherein the solder terminal is spaced apart from the semiconductor chip.

6. The electronic device according to claim 1 wherein the substrate comprises a first substrate, the electronic device further comprising:
    a second substrate bonded to the solder terminal so that the solder terminal provides an electrical and mechanical coupling between the first and second substrates.

7. The electronic device according to claim 6 further comprising:
    a semiconductor chip electrically and mechanically coupled to the first substrate so that the semiconductor chip is between the first and second substrates, wherein the semiconductor chip is spaced apart from the solder terminal.

8. The electronic device according to claim 1 wherein the solder terminal is centered in the opening so that a spacing between the solder terminal and the mold layer is substantially uniform around a perimeter of the solder terminal in a cross section taken parallel to a surface of the substrate.

9. An electronic device comprising:
   a packaging substrate;
   a semiconductor chip electrically and mechanically coupled to the packaging substrate;
   a mold layer on the packaging substrate surrounding the semiconductor chip, wherein the mold layer defines an opening therethrough spaced apart from the semiconductor chip; and
   a solder terminal bonded to the packaging substrate in the opening wherein an entirety of the solder terminal is spaced apart from a sidewall of the opening through the mold layer, wherein the solder terminal is substantially centered in the opening so that a spacing between the solder terminal and the mold layer is uniform around a perimeter of the solder terminal in a cross section taken parallel to a surface of the substrate, and wherein the solder terminal is spaced apart from the semiconductor chip.

10. The electronic device of claim 9 wherein the opening is a first opening, wherein the solder terminal is a first solder terminal, wherein the mold layer defines a second opening therethrough, and wherein the semiconductor chip is between the first and second openings, the electronic device further comprising:
   a second solder terminal bonded to the packaging substrate in the second opening wherein the second solder terminal is spaced apart from a sidewall of the second opening through the mold layer, and wherein the second solder terminal is substantially centered in the second opening so that a spacing between the second solder terminal and the mold layer is uniform around a perimeter of the second solder terminal in a cross section taken parallel to the surface of the substrate.

11. The electronic device of claim 10 wherein a width of the first opening at a surface of the mold layer spaced apart from the substrate is no greater than a width of the first opening between the surface of the mold layer spaced apart from the substrate and the substrate, and wherein a width of the second opening at the surface of the mold layer spaced apart from the substrate is no greater than a width of the second opening between the surface of the mold layer spaced apart from the substrate and the substrate.

12. The electronic device of claim 11 wherein the width of the first opening between the surface of the mold layer spaced apart from the substrate and the substrate is greater than the width of the first opening at the surface of the mold layer spaced apart from the substrate, and wherein the width of the second opening between the surface of the mold layer spaced apart from the substrate and the substrate is greater than the width of the second opening at the surface of the mold layer spaced apart from the substrate.

13. The electronic device of claim 11 wherein the first and second openings are undercut.

14. The electronic device of claim 11 wherein sidewalls of the first and second openings are substantially perpendicular with respect to the surface of the substrate.

15. The electronic device of claim 9 wherein the packaging substrate is a first packaging substrate, the electronic device further comprising:
   a second packaging substrate bonded to the solder terminal so that the solder terminal provides electrical and mechanical coupling between the first and second packaging substrates, wherein the semiconductor chip is between the first and second packaging substrates.

16. The electronic device of claim 15 wherein the semiconductor chip is a first semiconductor chip, the electronic device further comprising:
   a second semiconductor chip electrically and mechanically coupled to the second packaging substrate, wherein the second packaging substrate is between the first and second semiconductor chips.

17. The electronic device of claim 9 wherein a surface of the semiconductor chip spaced apart from the packaging substrate is free of the mold layer.

\* \* \* \* \*